(12) United States Patent
Lu et al.

(10) Patent No.: US 9,030,867 B2
(45) Date of Patent: May 12, 2015

(54) BIPOLAR CMOS SELECT DEVICE FOR RESISTIVE SENSE MEMORY

(75) Inventors: Yong Lu, Edina, MN (US); Hongyue Liu, Maple Grove, MN (US); Maroun Khoury, Burnsville, MN (US); Yiran Chen, Eden Prairie, MN (US)

(73) Assignee: Seagate Technology LLC, Cupertino, CA (US)

( * ) Notice: Subject to any disclaimer, the term of this patent is extended or adjusted under 35 U.S.C. 154(b) by 433 days.

(21) Appl. No.: 12/502,211

(22) Filed: Jul. 13, 2009

(65) Prior Publication Data

US 2010/0177554 A1    Jul. 15, 2010

Related U.S. Application Data

(60) Provisional application No. 61/106,821, filed on Oct. 20, 2008.

(51) Int. Cl.
| | |
|---|---|
| *G11C 11/00* | (2006.01) |
| *G11C 11/34* | (2006.01) |
| *G11C 13/00* | (2006.01) |
| *G11C 11/16* | (2006.01) |

(52) U.S. Cl.
CPC ............ *G11C 13/0004* (2013.01); *G11C 11/16* (2013.01); *G11C 13/0011* (2013.01); *G11C 13/003* (2013.01); *G11C 13/004* (2013.01); *G11C 2213/76* (2013.01)

(58) Field of Classification Search
USPC ................................... 365/177, 179, 148, 158
See application file for complete search history.

(56) References Cited

U.S. PATENT DOCUMENTS

| | | | |
|---|---|---|---|
| 3,982,233 | A | 9/1976 | Crookshanks |
| 3,982,235 | A | 9/1976 | Bennett |
| 3,982,266 | A | 9/1976 | Matzen |
| 4,056,642 | A | 11/1977 | Saxena |

(Continued)

FOREIGN PATENT DOCUMENTS

| | | |
|---|---|---|
| DE | 102008026432 | 12/2009 |
| EP | 1329895 | 7/2003 |

(Continued)

OTHER PUBLICATIONS

Adee, S., "Quantum Tunneling Creates Fast Lane for Wireless", IEEE Spectrum, Oct. 2007.

(Continued)

*Primary Examiner* — Vanthu Nguyen
*Assistant Examiner* — Khamdan Alrobaie
(74) *Attorney, Agent, or Firm* — Mueting, Raasch & Gebhardt, P.A.

(57) ABSTRACT

A resistive sense memory apparatus includes a bipolar select device having a semiconductor substrate and a plurality of transistors disposed in the semiconductor substrate and forming a row or transistors. Each transistor includes an emitter contact and a collector contact. Each collector contact is electrically isolated from each other and each emitter contact is electrically isolated from each other. A gate contact extends along a channel region between the emitter contact and a collector contact. A base contact is disposed within the semiconductor substrate such that the emitter contact and a collector contact is between the gate contact and the base contact. A resistive sense memory cells is electrically coupled to each collector contact or emitter contact and a bit line.

18 Claims, 5 Drawing Sheets

(56) References Cited

U.S. PATENT DOCUMENTS

| | | |
|---|---|---|
| 4,110,488 A | 8/1978 | Risko |
| 4,160,988 A | 7/1979 | Russell |
| 4,232,057 A | 11/1980 | Ray et al. |
| 4,247,915 A | 1/1981 | Bartlett |
| 4,323,589 A | 4/1982 | Ray et al. |
| 4,576,829 A | 3/1986 | Kaganowicz |
| 4,901,132 A | 2/1990 | Kuwano |
| 5,083,190 A | 1/1992 | Pfiester |
| 5,135,878 A | 8/1992 | Bartur |
| 5,278,636 A | 1/1994 | Williams |
| 5,330,935 A | 7/1994 | Dobuzinsky |
| 5,365,083 A | 11/1994 | Tada |
| 5,412,246 A | 5/1995 | Dobuzinsky |
| 5,443,863 A | 8/1995 | Neely |
| 5,580,804 A | 12/1996 | Joh |
| 5,614,430 A | 3/1997 | Liang |
| 5,739,564 A | 4/1998 | Kosa |
| 5,872,052 A | 2/1999 | Iyer |
| 5,913,149 A | 6/1999 | Thakur |
| 5,923,948 A | 7/1999 | Cathey, Jr. |
| 5,926,412 A | 7/1999 | Evans |
| 5,929,477 A | 7/1999 | McAllister |
| 6,011,281 A | 1/2000 | Nunokawa |
| 6,013,548 A | 1/2000 | Burns |
| 6,034,389 A | 3/2000 | Burns |
| 6,077,745 A | 6/2000 | Burns |
| 6,100,166 A | 8/2000 | Sakaguchi |
| 6,114,211 A | 9/2000 | Fulford |
| 6,121,642 A | 9/2000 | Newns |
| 6,121,654 A | 9/2000 | Likharev |
| 6,165,834 A | 12/2000 | Agarwal |
| 6,300,205 B1 | 10/2001 | Fulford |
| 6,341,085 B1 | 1/2002 | Yamagami |
| 6,346,477 B1 | 2/2002 | Kaloyeros |
| 6,376,332 B1 | 4/2002 | Yankagita |
| 6,448,840 B2 | 9/2002 | Kao |
| 6,534,382 B1 | 3/2003 | Sakaguchi |
| 6,617,642 B1 | 9/2003 | Georgesca |
| 6,624,463 B2 | 9/2003 | Kim |
| 6,653,704 B1 | 11/2003 | Gurney |
| 6,667,900 B2 | 12/2003 | Lowrey |
| 6,724,025 B1 | 4/2004 | Takashima |
| 6,750,540 B2 | 6/2004 | Kim |
| 6,753,561 B1 | 6/2004 | Rinerson |
| 6,757,842 B1 | 6/2004 | Harari |
| 6,781,176 B2 | 8/2004 | Ramesh |
| 6,789,689 B1 | 9/2004 | Beale |
| 6,800,897 B2 | 10/2004 | Baliga |
| 6,842,368 B2 | 1/2005 | Hayakawa |
| 6,853,031 B2 | 2/2005 | Lio |
| 6,917,539 B2 | 7/2005 | Rinerson |
| 6,940,742 B2 | 9/2005 | Yamamura |
| 6,944,052 B2 | 9/2005 | Subramanian |
| 6,979,863 B2 | 12/2005 | Ryu |
| 7,009,877 B1 | 3/2006 | Huai |
| 7,045,840 B2 | 5/2006 | Tamai |
| 7,051,941 B2 | 5/2006 | Yui |
| 7,052,941 B2 | 5/2006 | Lee |
| 7,098,494 B2 | 8/2006 | Pakala |
| 7,130,209 B2 | 10/2006 | Reggiori |
| 7,161,861 B2 | 1/2007 | Gogl |
| 7,180,140 B1 | 2/2007 | Brisbin |
| 7,187,577 B1 | 3/2007 | Wang |
| 7,190,616 B2 | 3/2007 | Forbes |
| 7,200,036 B2 | 4/2007 | Bessho |
| 7,215,568 B2 | 5/2007 | Liaw |
| 7,218,550 B2 | 5/2007 | Schwabe |
| 7,224,601 B2 | 5/2007 | Panchula |
| 7,233,537 B2 | 6/2007 | Tanizaki |
| 7,236,394 B2 | 6/2007 | Chen |
| 7,247,570 B2 | 7/2007 | Thomas |
| 7,272,034 B1 | 9/2007 | Chen |
| 7,272,035 B1 | 9/2007 | Chen |
| 7,273,638 B2 | 9/2007 | Belyansky |
| 7,274,067 B2 | 9/2007 | Forbes |
| 7,282,755 B2 | 10/2007 | Pakala |
| 7,285,812 B2 | 10/2007 | Tang |
| 7,286,395 B2 | 10/2007 | Chen |
| 7,289,356 B2 | 10/2007 | Diao |
| 7,345,912 B2 | 3/2008 | Luo |
| 7,362,618 B2 | 4/2008 | Harari |
| 7,378,702 B2 | 5/2008 | Lee |
| 7,379,327 B2 | 5/2008 | Chen |
| 7,381,595 B2 | 6/2008 | Josh |
| 7,382,024 B2 | 6/2008 | Ito |
| 7,391,068 B2 | 6/2008 | Kito |
| 7,397,713 B2 | 7/2008 | Harari |
| 7,413,480 B2 | 8/2008 | Thomas |
| 7,414,908 B2 | 8/2008 | Miyatake |
| 7,416,929 B2 | 8/2008 | Mazzola |
| 7,432,574 B2 | 10/2008 | Nakamura |
| 7,440,317 B2 | 10/2008 | Bhattacharyya |
| 7,459,717 B2 | 12/2008 | Lung |
| 7,465,983 B2 | 12/2008 | Eldridge |
| 7,470,142 B2 | 12/2008 | Lee |
| 7,470,598 B2 | 12/2008 | Lee |
| 7,502,249 B1 | 3/2009 | Ding |
| 7,515,457 B2 | 4/2009 | Chen |
| 7,529,114 B2 | 5/2009 | Asao |
| 7,542,356 B2 | 6/2009 | Lee |
| 7,646,629 B2 | 1/2010 | Hamberg |
| 7,697,322 B2 | 4/2010 | Leuschner |
| 7,738,279 B2 | 6/2010 | Siesazeck |
| 7,738,881 B2 | 6/2010 | Krumm |
| 7,745,894 B2 * | 6/2010 | Asao et al. .................. 257/421 |
| 7,791,057 B2 | 9/2010 | Lung |
| 2001/0046154 A1 * | 11/2001 | Forbes ........................ 365/149 |
| 2002/0081822 A1 | 6/2002 | Yanageta |
| 2002/0136047 A1 | 9/2002 | Scheuerlein |
| 2003/0045064 A1 | 3/2003 | Kunikiyo |
| 2003/0168684 A1 | 9/2003 | Pan |
| 2004/0084725 A1 | 5/2004 | Nishiwaki |
| 2004/0114413 A1 | 6/2004 | Parkinson |
| 2004/0114438 A1 | 6/2004 | Morimoto |
| 2004/0257878 A1 | 12/2004 | Morikawa |
| 2004/0262635 A1 | 12/2004 | Lee |
| 2005/0044703 A1 | 3/2005 | Liu |
| 2005/0092526 A1 | 5/2005 | Fielder |
| 2005/0122768 A1 | 6/2005 | Fukumoto |
| 2005/0145947 A1 | 7/2005 | Russ |
| 2005/0169043 A1 | 8/2005 | Yokoyama |
| 2005/0218521 A1 | 10/2005 | Lee |
| 2005/0253143 A1 | 11/2005 | Takaura |
| 2005/0280042 A1 | 12/2005 | Lee |
| 2005/0280061 A1 | 12/2005 | Lee |
| 2005/0280154 A1 | 12/2005 | Lee |
| 2005/0280155 A1 | 12/2005 | Lee |
| 2005/0280156 A1 | 12/2005 | Lee |
| 2005/0282356 A1 | 12/2005 | Lee |
| 2006/0073652 A1 | 4/2006 | Pellizzer |
| 2006/0105517 A1 | 5/2006 | Johansson |
| 2006/0131554 A1 | 6/2006 | Joung |
| 2006/0275962 A1 | 12/2006 | Lee |
| 2007/0007536 A1 | 1/2007 | Hidaka |
| 2007/0077694 A1 | 4/2007 | Lee |
| 2007/0105241 A1 | 5/2007 | Leuschner |
| 2007/0115749 A1 | 5/2007 | Gilbert |
| 2007/0165442 A1 * | 7/2007 | Hosoi et al. .................. 365/100 |
| 2007/0253245 A1 | 11/2007 | Ranjan |
| 2007/0279968 A1 | 12/2007 | Luo |
| 2007/0281439 A1 | 12/2007 | Bedell |
| 2007/0297223 A1 * | 12/2007 | Chen et al. .................. 365/173 |
| 2008/0007993 A1 | 1/2008 | Saitoh |
| 2008/0025083 A1 * | 1/2008 | Okhonin et al. ............ 365/177 |
| 2008/0029782 A1 | 2/2008 | Carpenter |
| 2008/0032463 A1 | 2/2008 | Lee |
| 2008/0037314 A1 | 2/2008 | Ueda |
| 2008/0038902 A1 | 2/2008 | Lee |
| 2008/0048327 A1 | 2/2008 | Lee |
| 2008/0094873 A1 | 4/2008 | Lai |
| 2008/0108212 A1 | 5/2008 | Moss |
| 2008/0144355 A1 | 6/2008 | Boeve |
| 2008/0170432 A1 | 7/2008 | Asao |
| 2008/0191312 A1 | 8/2008 | Oh |

(56) References Cited

U.S. PATENT DOCUMENTS

| | | | |
|---|---|---|---|
| 2008/0261380 A1 | 10/2008 | Lee | |
| 2008/0265360 A1 | 10/2008 | Lee | |
| 2008/0273380 A1 | 11/2008 | Diao | |
| 2008/0310213 A1 | 12/2008 | Chen | |
| 2008/0310219 A1 | 12/2008 | Chen | |
| 2009/0014719 A1 | 1/2009 | Shimizu | |
| 2009/0014836 A1* | 1/2009 | Lee et al. | 257/536 |
| 2009/0040855 A1 | 2/2009 | Luo | |
| 2009/0052225 A1 | 2/2009 | Morimoto | |
| 2009/0072246 A1 | 3/2009 | Genrikh | |
| 2009/0072279 A1 | 3/2009 | Moselund | |
| 2009/0161408 A1 | 6/2009 | Tanigami | |
| 2009/0162979 A1 | 6/2009 | Yang | |
| 2009/0185410 A1 | 7/2009 | Huai | |
| 2009/0296449 A1 | 12/2009 | Slesazeck | |
| 2010/0007344 A1 | 1/2010 | Guo | |
| 2010/0008122 A1* | 1/2010 | Tilke | 365/148 |
| 2010/0046285 A1 | 2/2010 | Lung | |
| 2010/0067281 A1 | 3/2010 | Xi | |
| 2010/0078620 A1 | 4/2010 | Xi | |
| 2010/0110756 A1 | 5/2010 | Khoury | |
| 2010/0142256 A1 | 6/2010 | Kumar | |
| 2010/0149856 A1 | 6/2010 | Tang | |
| 2013/0264630 A1* | 10/2013 | Kim et al. | 257/321 |

FOREIGN PATENT DOCUMENTS

| | | |
|---|---|---|
| WO | WO 0062346 | 10/2000 |
| WO | WO 0215277 | 2/2002 |
| WO | WO 2005/124787 | 12/2005 |
| WO | WO 2006/100657 | 9/2006 |
| WO | WO 2007/100626 | 9/2007 |
| WO | WO 2007/128738 | 11/2007 |

OTHER PUBLICATIONS

Chung et al., A New SOI Inverter for Low Power Applications, Proceedings 1996 IEEE International SOI Conference, Oct. 1996.

Giacomini, R., et al., Modeling Silicon on Insulator MOS Transistors with Nonrectangular-Gate Layouts, Journal of the Electrochemical Society, 2006, pp. G218-G222, vol. 153, No. 3.

Hosomi et al., A Novel Nonvolatile Memory with Spin Torque Transfer Magnetization Switching: Spin-RAM, 2005 IEEE.

Hwang et al., Degradation of MOSFET's Drive Current Due to Halo Ion Implantation, Electron Devices Meeting, 1996, International Date: Dec. 8-11, 1996, pp. 567-570.

Internet website www.en.wikipedia.org/wiki/High-k dated Nov. 12, 2008.

Likharev, K., "Layered tunnel barrier for nonvolatile memory devices", Applied Physics Letters vol. 73, No. 15; Oct. 12, 1998.

Londergran et al., Interlayer Mediated Epitaxy of Cobalt Silicide on Silicon (100) from Low Temperature Chemical Vapor Deposition of Cobalt, Journal of the Electrochemical Society, 148 (1) C21-C27 (2001) C21.

PCT/ISA/210 Int'l. Search Report and PCT/ISA/237 Written Opinion for PCT/US2010/041134 from the EPO.

Romanyuk, A., et al., Temperature-induced metal-semiconductor transition in W-doped $VO_2$ films studied by photoelectron spectroscopy, Solar Energy Materials and Solar Cells, 2007, pp. 1831-1835, No. 91, Elsevier, Switzerland.

Sayan, S., "Valence and conduction band offsets of a $ZrO_2/SiOxNy/$ n-Si CMOS gate stack: A combined photoemission and inverse photoemission study", Phys. Stat. Sol. (b) 241, No. 10, pp. 2246-2252 (2004).

Takato et al., High Performance CMOS Surrounding Gate Transistor (SGT) for Ultra High Density LSIs, Downloaded on Apr. 14, 2009 from IEEE Xplore, pp. 222-225.

U.S. Appl. No. 12/175,545, filed Jul. 18, 2008, Inventors: Lou et al., Our Ref: 14229.00.

U.S. Appl. No. 12/120,715, filed May 15, 2008, Inventors: Tian et al.

U.S. Appl. No. 12/502,211, filed Jul. 13, 2009, Inventor: Lu.

Wang et al., Precision Control of Halo Implanation for Scaling-down ULSI Manufacturing, IEEE International Symposium on Sep. 13-15, 2005, pp. 204-207.

Zahler, James, et al., Wafer Bonding and Layer Transfer Processes for High Efficiency Solar Cells, NCPV and Solar Program Review Meeting, pp. 723-726, 2003.

Berger et al., Merged-Transitor Logic (MTL)-A Low-Cost Bipolar Logic Concept, Solid-State Circuits, IEEE Journal, vol. 7, Issue 5, pp. 340-346 (2003).

U.S. Appl. No. 12/498,661, filed Jun. 7, 2009, Khoury.

\* cited by examiner

US 9,030,867 B2

BIPOLAR CMOS SELECT DEVICE FOR RESISTIVE SENSE MEMORY

RELATED APPLICATIONS

This application claims priority to U.S. provisional patent application No. 61/106,821, filed Oct. 20, 2008. The entire disclosure of application No. 61/106,821 is incorporated herein by reference.

BACKGROUND

Fast growth of the pervasive computing and handheld/communication industry has generated exploding demand for high capacity nonvolatile solid-state data storage devices. Current technology like flash memory has several drawbacks such as slow access speed, limited endurance, and the integration difficulty. Flash memory (NAND or NOR) also faces significant scaling problems.

Resistive sense memories are promising candidates for future nonvolatile and universal memory by storing data bits as either a high or low resistance state. One such memory, MRAM, features non-volatility, fast writing/reading speed, almost unlimited programming endurance and zero standby power. The basic component of MRAM is a magnetic tunneling junction (MTJ). MRAM switches the MTJ resistance by using a current induced magnetic field to switch the magnetization of MTJ. As the MTJ size shrinks, the switching magnetic field amplitude increases and the switching variation becomes more severe. Resistive RAM (RRAM) is another resistive sense memory that has a variable resistance layer that can switch between a high resistance state and a low resistance state (for example by the presence or absence of a conductive filament) by applicant of a current or voltage.

However, some yield-limiting factors must be overcome before resistive sense memory enters the production stage. One challenge is that the resistive sense memory element often requires a large current in order for writing to occur. In particular, spin torque RAM (STRAM) requires high currents at fast write speeds. MOSFET select transistors have been used in such resistive sense memories. However, the area required by the MOSFET to achieve the currents needed is large. There is a need for select devices having reduced area requirements at specified writing currents for resistive sense memories.

BRIEF SUMMARY

The present disclosure relates to a bipolar select device for resistive sense memory. In particular, the present disclosure relates to a resistive sense memory apparatus that includes a bipolar select transistor that has high drive current capability for its size. The bipolar select transistor consumes a small area and shares one contact across multiple memory cells.

One illustrative resistive sense memory apparatus includes a bipolar select device having a semiconductor substrate and a plurality of transistors disposed in the semiconductor substrate and forming a row or transistors. Each transistor includes an emitter contact and a collector contact. Each collector contact is electrically isolated from each other and each emitter contact is electrically isolated from each other. A gate contact extends along a channel region between the emitter contact and a collector contact. A base contact is disposed within the semiconductor substrate such that the emitter contact and a collector contact is between the gate contact and the base contact. A resistive sense memory cells is electrically coupled to each collector contact or emitter contact and a bit line.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1:
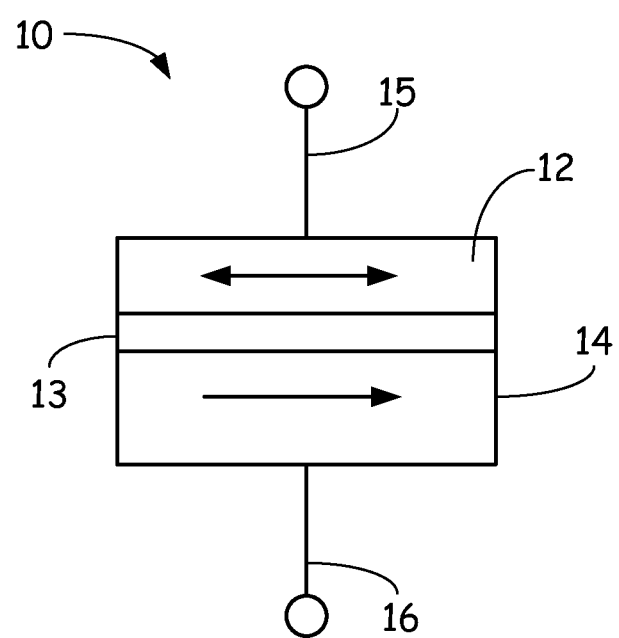
FIG. 1 is a cross-sectional schematic diagram of an illustrative magnetic tunnel junction data cell.

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure relates to a bipolar select device for resistive sense memory. In particular, the present disclosure relates to a resistive sense memory apparatus that includes a bipolar select transistor that has high drive current capability for its size. The bipolar select transistor consumes a small area and shares one contact across multiple memory cells, thus the number of electrical contacts is reduced. The bipolar select device is a complementary metal-oxide-semiconductor (CMOS) bipolar select device that can be fabricated utilizing silicon on insulator (SOI) technology. By utilizing a body bias, the metal-oxide-semiconductor field effect transistor (MOSFET) is transformed into a lateral bipolar transistor. While the present disclosure is not so limited, an appreciation of various aspects of the disclosure will be gained through a discussion of the examples provided below.

Variable resistive memory includes memory cells that switch between at least a low resistance data state and a high resistance data state by passing a write current through the resistive memory cell (i.e., resistive RAM or RRAM). In some embodiments the resistive memory cell is a phase change data cell (i.e., PCRAM) or a programmable metallization data cell (i.e., PMCRAM). In some embodiments the resistive memory is a magnetic tunnel junction such as, for example, a spin transfer torque memory cell (i.e., STRAM). These magnetic tunnel junction data cells are further described below. Semiconductor fabrication techniques can be utilized to form the resistive sense memory apparatus and arrays described herein. The terms "emitter" and "collector" are interchangeable depending on the direction current is flowing through the resistive sense memory apparatus and arrays described herein.

The resistive sense memory apparatus described herein allows bipolar electrical conduction through the device at bulk conduction transport rates, allowing higher current flow per area than conventional semiconductor transistor select devices. Thus, the area required for each resistive sense memory apparatus can be reduced and the density of the memory array is increased, as compared to conventional memory array devices. Thus the select devices described herein can be termed as either NPN or PNP devices. An NPN device can have a deep Pwell for isolation purposes and a PNP device can have a deep Nwell for isolation purposes. In either case, an oxide region can work for isolation purposes.

FIG. 1 is a cross-sectional schematic diagram of an illustrative magnetic tunnel junction data cell 10. The magnetic tunnel junction data cell 10 includes a ferromagnetic free layer 12 and a ferromagnetic reference (i.e., pinned) layer 14. The ferromagnetic free layer 12 and a ferromagnetic reference layer 14 are separated by an oxide barrier layer 13 or tunnel barrier. A first electrode 15 is in electrical contact with the ferromagnetic free layer 12 and a second electrode 16 is in electrical contact with the ferromagnetic reference layer 14. The ferromagnetic layers 12, 14 may be made of any useful ferromagnetic (FM) alloys such as, for example, Fe, Co, Ni and the insulating barrier layer 13 may be made of an electrically insulating material such as, for example an oxide material (e.g., $Al_2O_3$ or MgO). Other suitable materials may also be used.

The electrodes 15, 16 electrically connect the ferromagnetic layers 12, 14 to a control circuit providing read and write currents through the ferromagnetic layers 12, 14. The resistance across the magnetic tunnel junction data cell 10 is determined by the relative orientation of the magnetization vectors or magnetization orientations of the ferromagnetic layers 12, 14. The magnetization direction of the ferromagnetic reference layer 14 is pinned in a predetermined direction while the magnetization direction of the ferromagnetic free layer 12 is free to rotate under the influence of a spin torque. Pinning of the ferromagnetic reference layer 14 may be achieved through, e.g., the use of exchange bias with an antiferromagnetically ordered material such as PtMn, IrMn and others. When the magnetization orientation of the ferromagnetic free layer 12 is parallel and in the same direction of the magnetization orientation of the ferromagnetic reference layer 14 the magnetic tunnel junction is described as being in the low resistance state or "0"data state. When the magnetization orientation of the ferromagnetic free layer 12 is antiparallel and in the opposite direction of the magnetization orientation of the ferromagnetic reference layer 14 the magnetic tunnel junction is described as being in the high resistance state or "1" data state.

Switching the resistance state and hence the data state of the magnetic tunnel junction data cell 10 via spin-transfer occurs when a current, passing through a magnetic layer of the magnetic tunnel junction data cell 10, becomes spin polarized and imparts a spin torque on the free layer 12 of the magnetic tunnel junction data cell 10. When a sufficient spin torque is applied to the free layer 12, the magnetization orientation of the free layer 12 can be switched between two opposite directions and accordingly the magnetic tunnel junction data cell 10 can be switched between the parallel state (i.e., low resistance state or "0" data state) and anti-parallel state (i.e., high resistance state or "1" data state) depending on the direction of the current.

The illustrative spin-transfer torque magnetic tunnel junction data cell 10 may be used to construct a memory device that includes multiple magnetic tunnel junction data cells in an array where a data bit is stored in magnetic tunnel junction data cell by changing the relative magnetization state of the free magnetic layer 12 with respect to the pinned magnetic layer 14. The stored data bit can be read out by measuring the resistance of the cell which changes with the magnetization direction of the free layer relative to the pinned magnetic layer. In order for the spin-transfer torque magnetic tunnel junction data cell 10 to have the characteristics of a non-volatile random access memory, the free layer exhibits thermal stability against random fluctuations so that the orientation of the free layer is changed only when it is controlled to make such a change.

Figure 2:
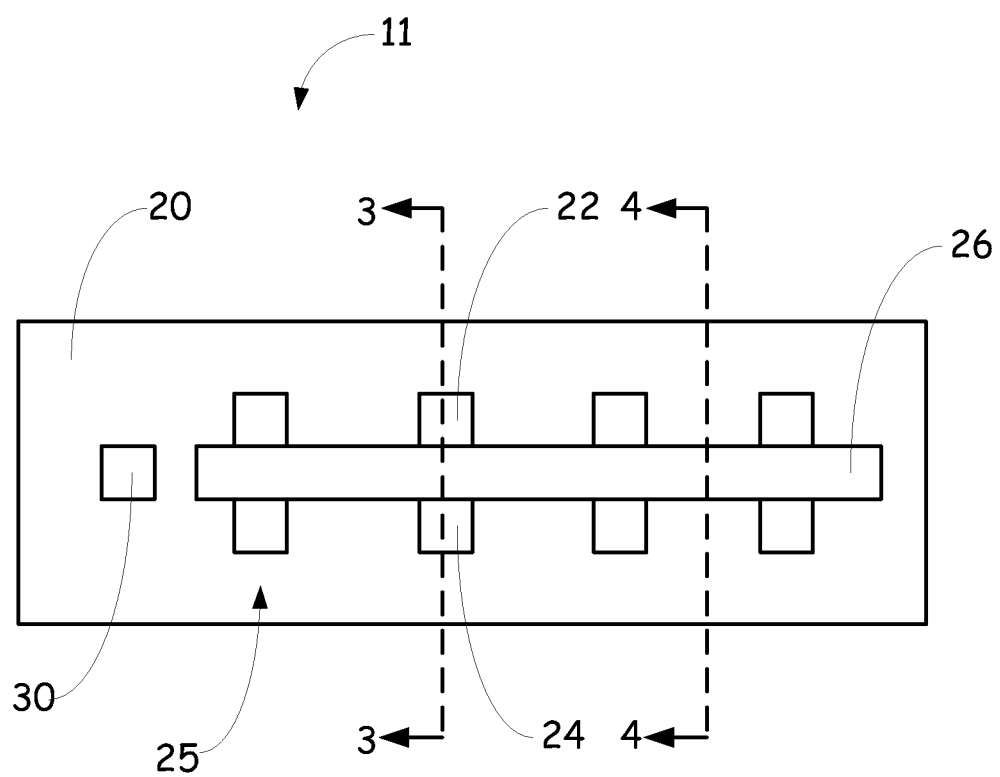
FIG. 2 is a top view schematic diagram of an illustrative resistive sense memory device or appartus.

FIG. 2 is a top view schematic diagram of an illustrative resistive sense memory apparatus. The resistive sense memory apparatus that includes a bipolar select device 11 electrically coupled to a plurality of resistive sense memory cells (illustrated in FIG. 3). The bipolar select device 11 can be a complementary metal-oxide-semiconductor (CMOS) bipolar select device that is fabricated utilizing silicon on insulator (SOI) technology.

Four transistors 25 are arranged in a row forming a row of transistors on the bipolar select device 11. The transistors 25 are disposed in a semiconductor substrate and can be referred to as MOSFETs. The transistors 25 are electrically isolated from each other. While the row of transistors includes four transistors 25, the row of transistors can include any number of transistors 25 or plurality of transistors 25. Forming multiple rows of transistors on a semiconductor substrate creates a resistive sense memory array, where each row of transistors are electrically isolated from each other.

Each transistor 25 is disposed on or at least partially within a semiconductor substrate 20. Each transistor 25 includes a collector contact 22 and an emitter contact 24. As described above, collector and emitter contacts are interchangeable depending on the direction of current flowing through the transistor 25. The collector contact 22 and an emitter contact 24 can also be described as a source contact and a drain contact. The collector contact 22 and an emitter contact 24 are electrically isolated from each other and separated from each other by a channel region. A gate contact 26 extends along the channel region and spans between the collector contact 22 and an emitter contact 24.

A base contact 30 is disposed within the semiconductor substrate 20. The illustrated base contact 24 extends from the surface of the semiconductor substrate 20 to a base contact layer (see FIG. 3) that is buried within the semiconductor substrate 20. The base contact 30 allows the particular transistor 25 to be body biased and allow the transistor 25 to effectively turn into a lateral bipolar transistor.

Figure 3:
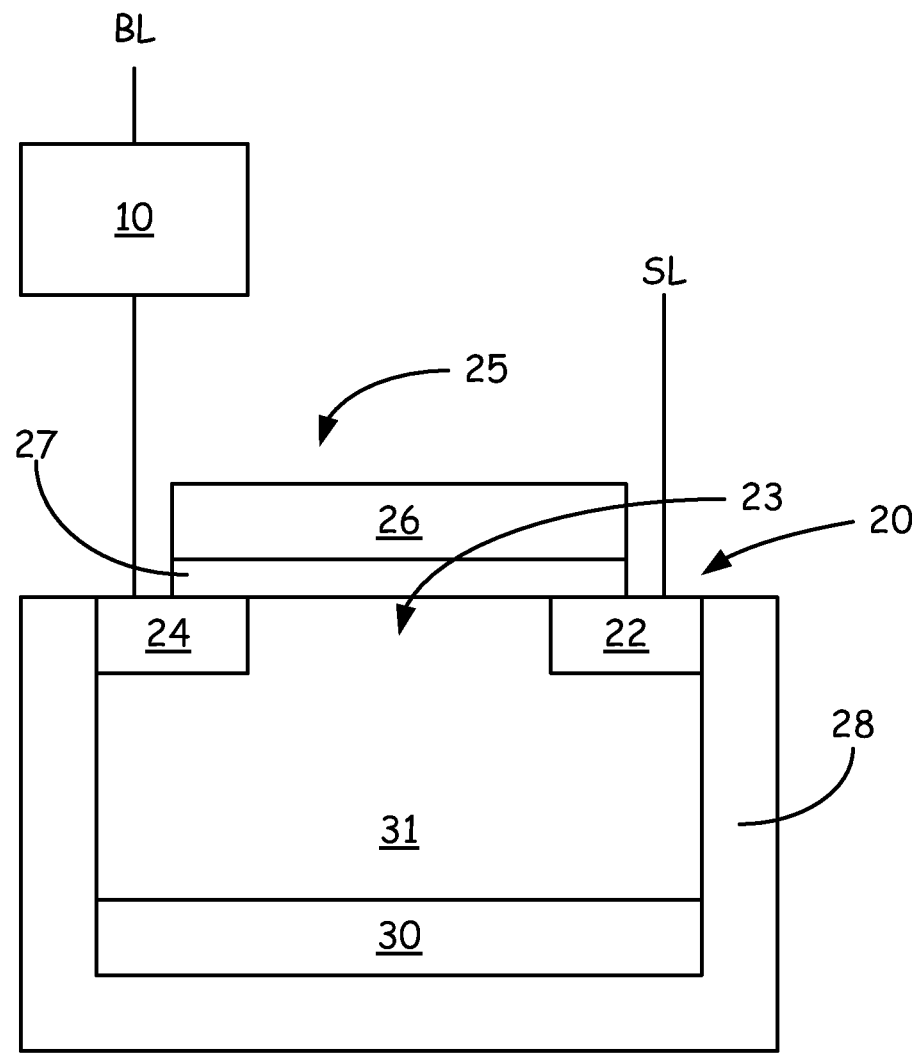
FIG. 3 is a cross-sectional schematic diagram of the illustrative resistive sense memory apparatus of FIG. 2 taken along line 3-3.

FIG. 3 is a cross-sectional schematic diagram of the illustrative resistive sense memory device of FIG. 2 taken along line 3-3. This cross-section is taken through a transistor 25. The transistor 25 includes a collector contact 22 and an emitter contact 24. As described above, collector and emitter contacts are interchangeable depending on the direction of current flowing through the transistor 25.

The collector contact 22 and an emitter contact 24 are electrically isolated from each other and separated from each other by a channel region 23. A gate contact 26 extends along the channel region 23 and spans between the collector contact 22 and an emitter contact 24. A gate contact insulator layer 27 electrically isolates the gate contact 26 from the semiconductor substrate 20, as is known in MOSFET construction. The collector contact 22 and an emitter contact 24 can be regions of the semiconductor substrate 20 that are doped with an N type or P type conductivity material.

A source line SL is illustrated as being electrically coupled to the collector contact 22 and a resistive sense memory cell 10 and a bit line BL is illustrated as being electrically coupled to the emitter contact 24. In some embodiments a source line SL is electrically coupled to the emitter contact 24 and a resistive sense memory cell 10 and a bit line BL is electrically coupled to the collector contact 22.

The base contact 30 is disposed within the semiconductor substrate 20. The base contact 30 is arranged such that the emitter contact 24 and the collector contact 24 are between the base contact 30 and the gate contact 26. The base contact 30 is spaced apart from the emitter contact 24 and the collector contact 24. The base contact 30 is a common base contact for the row of transistors and the base contact 30 extends along the length of the row of transistors. In many embodiments, the gate contact 26 and the base contact 30 are co-extensive along a length of the row of transistors forming the bipolar select device 11.

When the collector contact 22 and the emitter contact 24 are doped with an N type conductivity material the base contact is doped with a high level of P type (P+) type conductivity dopant material. When the collector contact 22 and the emitter contact 24 are doped with a P type conductivity material the base contact is doped with a high level of N type (N+) type conductivity dopant material. A lightly doped region or layer 31 separates the collector contact 22 and the emitter contact 24 from the base contact 30. The lightly doped region or layer 31 has the same conductivity type as the base contact 30, but with a lower lever of doping (e.g., P or P− or N or N−). The lightly doped region or layer 31 and the base contact 30 are electrically isolated by an insulating material 28 encompassing the lightly doped region or layer 31 and the base contact 30. The insulating material 28 can be any useful electrically insulating material such as, an oxide, for example.

Applying a forward bias through the resistive sense memory cell 10 and the bipolar select device 11 writes a first or low resistance data state to the resistive sense memory cell 10. Applying a reverse bias through the resistive sense memory cell 10 and the bipolar select device 11 writes a second or high resistance data state to the resistive sense memory cell 10. By utilizing a body bias (on the base contact 30), the metal-oxide-semiconductor field effect transistor (MOSFET) is transformed into a lateral bipolar transistor.

Figure 4:
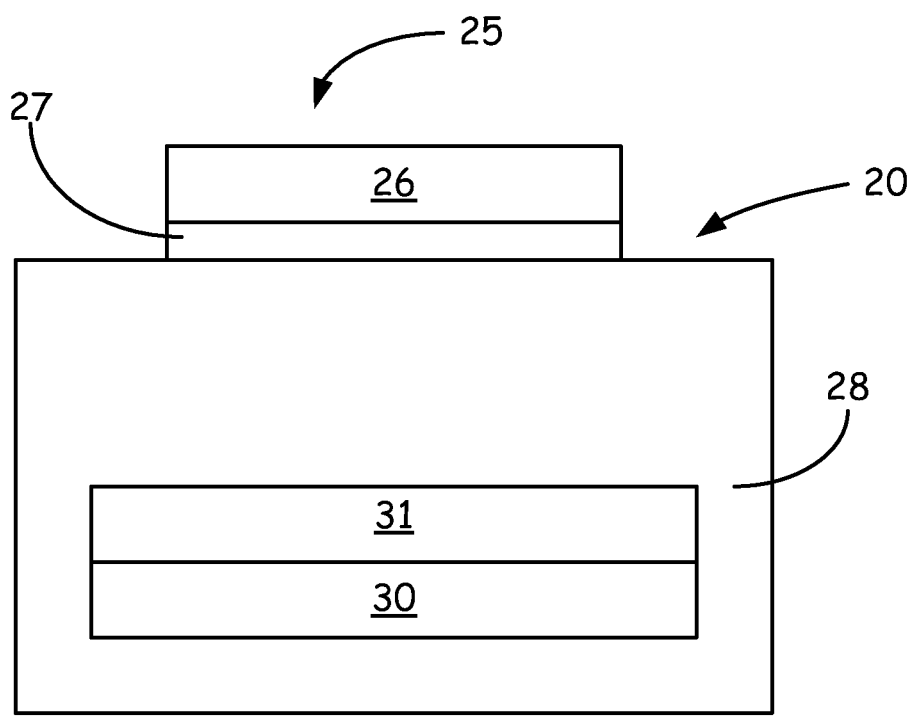
FIG. 4 is a cross-sectional schematic diagram of the illustrative resistive sense memory apparatus of FIG. 2 taken along line 4-4.

FIG. 4 is a cross-sectional schematic diagram of the illustrative resistive sense memory apparatus of FIG. 2 taken along line 4-4. The lightly doped region or layer 31 and the base contact 30 are illustrated as being co-extensive along a length of the bipolar select device. The gate contact insulator layer 27 electrically isolates the gate contact 26 from the semiconductor substrate 20, as is known in MOSFET construction.

Insulating material 28 encompassing the lightly doped region or layer 31 and the base contact 30. The insulating material 28 isolates the transistors 25 from each other along the row of transistors of the bipolar select device. The insulating material 28 can be any useful electrically insulating material such as, an oxide, for example.

Figure 5:
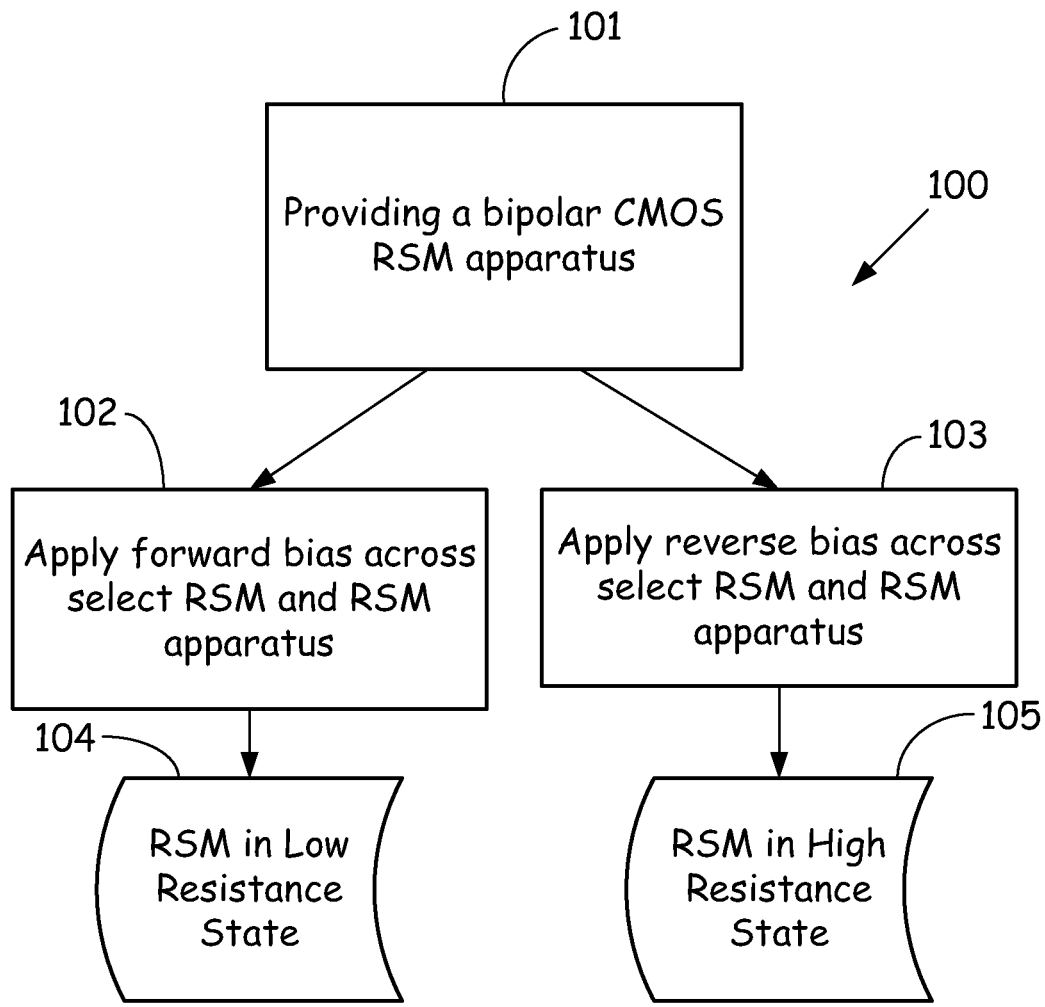
FIG. 5 is a flow diagram of an illustrative method of writing to a memory unit array.

FIG. 5 is a flow diagram of an illustrative method of writing to a memory unit array 100. The method includes providing a bipolar resistive sense memory (RSM) apparatus as described above, at block 101. Then the method includes writing a first data state (i.e., low resistance state) to a plurality of resistive sense memory cells by applying a forward bias across an transistor of a bipolar select device and selected bit lines electrically coupled to the plurality of resistive sense memory cells to be written to at block 102.

Alternatively the method includes writing a second data state (i.e., high resistance state) to a plurality of resistive sense memory cells by applying a reverse bias across a transistor of a bipolar select device and selected bit lines electrically coupled to the plurality of resistive sense memory cells to be written to at block 103. The forward bias condition places one or more resistive sense memory cells in the low resistance state at block 104 and reverse bias condition places one or more resistive sense memory cells in the high resistance state at block 105. By utilizing a body bias (on the base contact), the metal-oxide-semiconductor field effect transistor (MOSFET) is transformed into a lateral bipolar transistor.

Thus, embodiments of the BIPOLAR CMOS SELECT DEVICE FOR RESISTIVE SENSE MEMORY are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A resistive sense memory apparatus comprising:
   a bipolar select device comprising:
      a semiconductor substrate;
      a plurality of field effect transistors disposed in the semiconductor substrate and forming a row of field effect transistors, each field effect transistor comprising an emitter contact and a collector contact, wherein each collector contact is electrically isolated from each other and each emitter contact is electrically isolated from each other, a gate contact layer extends along a channel region between the emitter contact and a collector contact;
      a base contact layer is disposed within the semiconductor substrate such that the emitter contact and a collector contact is between the gate contact layer and the base contact layer, the base contact layer extends along a length of the row of field effect transistors and provides a body bias to each field effect transistor in the row of field effect transistors at the same time; and
   a plurality of resistive sense memory cells, wherein one of the plurality of resistive sense memory cells is electrically between one of the collector contacts or emitter contacts and a bit line.

2. A resistive sense memory apparatus according to claim 1, wherein the collector contacts and the emitter contacts have N type conductivity and the base layer has P+ type conductivity.

3. A resistive sense memory apparatus according to claim 2, wherein each field effect transistor further comprises a layer of P− type conductivity separating the base layer from the collector contacts and the emitter contacts.

4. A resistive sense memory apparatus according to claim 1, wherein the collector contacts and the emitter contacts have P type conductivity and the base layer has N+ type conductivity.

5. A resistive sense memory apparatus according to claim 4, wherein each field effect transistor further comprises a layer of N− type conductivity separating the base layer from the collector contacts and the emitter contacts.

6. A resistive sense memory apparatus according to claim 1, wherein the resistive sense memory cells comprise magnetic tunnel junctions switchable between a high resistance data state and a low resistance data state by spin torque transfer of a polarized current through the magnetic tunnel junction.

7. A resistive sense memory apparatus according to claim 1, wherein the gate contact layer is a common gate contact layer for the row of field effect transistors and extends along a length of the row of field effect transistors and the common gate contact layer is co-extensive with the base contact layer along a length of the row of field effect transistors.

8. A resistive sense memory apparatus according to claim 1, further comprising a plurality of bipolar select devices, wherein each bipolar select device forms a row of a memory array.

9. A resistive sense memory apparatus according to claim 8, wherein each bipolar select device is electrically isolated from each other.

10. A resistive sense memory array, comprising:
a plurality of bipolar select devices, each bipolar select device forming a row of a memory array, each bipolar select device comprising:
a semiconductor substrate;
a plurality of field effect transistors disposed in the semiconductor substrate and forming a row of field effect transistors, each field effect transistor comprising an emitter contact and a collector contact, wherein each collector contact is electrically isolated from each other and each emitter contact is electrically isolated from each other, a gate contact layer extends along a channel region between the emitter contact and a collector contact, the gate contact layer is a common gate contact layer for the row of field effect transistors and extends along a length of the row of field effect transistors;
a base contact layer is disposed within the semiconductor substrate such that the emitter contact and a collector contact is between the gate contact layer and the base contact layer, the base contact layer extends along a length of the row of field effect transistors and provides a body bias to each field effect transistor in the row of field effect transistors at the same time, and the gate contact layer is co-extensive with the base contact layer along a length of the row of field effect transistors; and
a plurality of resistive sense memory cells, wherein one of the plurality of resistive sense memory cells is electrically between one of the collector contacts or emitter contacts and a bit line.

11. A resistive sense memory array according to claim 10, wherein each bipolar select device is electrically isolated from each other.

12. A resistive sense memory array according to claim 10, wherein the resistive sense memory cells comprise magnetic tunnel junctions switchable between a high resistance data state and a low resistance data state by spin torque transfer of a polarized current through the magnetic tunnel junction.

13. A resistive sense memory array according to claim 10, further comprising a plurality of bipolar select devices, wherein each bipolar select device forms a row of a memory array.

14. A resistive sense memory array according to claim 10, wherein the collector contacts and the emitter contacts have N type conductivity and the base layer has P+ type conductivity and each field effect transistor further comprises a layer of P− type conductivity separating the base layer from the collector contacts and the emitter contacts.

15. A resistive sense memory array according to claim 10, wherein the collector contacts and the emitter contacts have P type conductivity and the base layer has N+ type conductivity and each field effect transistor further comprises a layer of N− type conductivity separating the base layer from the collector contacts and the emitter contacts.

16. A method, comprising:
writing a first data state to a plurality of resistive sense memory cells by applying a forward bias across a bipolar CMOS select device and selected bit lines electrically coupled to the plurality of resistive sense memory cells to be written to, wherein the bipolar CMOS select device comprises:
a semiconductor substrate;
a plurality of field effect transistors disposed in the semiconductor substrate and forming a row or transistors, each field effect transistor comprising an emitter contact and a collector contact, wherein each collector contact is electrically isolated from each other and each emitter contact is electrically isolated from each other, a gate contact layer extends along a channel region between the emitter contact and a collector contact;
a base contact layer is disposed within the semiconductor substrate such that the emitter contact and a collector contact is between the gate contact layer and the base contact layer, the base contact layer extends along a length of the row of field effect transistors and provides a body bias to each field effect transistor in the row of field effect transistors at the same time.

17. A method according to claim 16, further comprising writing a second data state to a plurality of resistive sense memory cells by applying a reverse bias across bipolar CMOS select device and selected bit lines electrically coupled to the plurality of resistive sense memory cells to be written to.

18. A method according to claim 16, wherein the gate contact layer is a common gate contact layer for the row of transistors and extends along a length of the row of transistors and the gate contact layer is co-extensive with the base contact layer along a length of the row of transistors.

* * * * *